(12) United States Patent
Kubena et al.

(10) Patent No.: US 7,830,074 B2
(45) Date of Patent: Nov. 9, 2010

(54) INTEGRATED QUARTZ OSCILLATOR ON AN ACTIVE ELECTRONIC SUBSTRATE

(75) Inventors: Randall L. Kubena, Oak Park, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 388 days.

(21) Appl. No.: 11/881,461

(22) Filed: Jul. 27, 2007

(65) Prior Publication Data

US 2008/0258829 A1    Oct. 23, 2008

Related U.S. Application Data

(60) Provisional application No. 60/836,600, filed on Aug. 8, 2006.

(51) Int. Cl.
*H01L 41/09* (2006.01)
(52) U.S. Cl. .................. 310/361; 310/348; 310/365
(58) Field of Classification Search ................ 310/312, 310/344, 348, 361, 365
See application file for complete search history.

(56) References Cited

U.S. PATENT DOCUMENTS

| | | | | |
|---|---|---|---|---|
| 2,487,165 | A * | 11/1949 | Miller | 310/363 |
| 3,390,287 | A * | 6/1968 | Sonderegger | 310/329 |
| 3,766,616 | A | 10/1973 | Staudte | |
| 4,364,016 | A | 12/1982 | Tanski | |
| 4,442,574 | A | 4/1984 | Wanuga et al. | |
| 5,260,596 | A | 11/1993 | Dunn et al. | |
| 5,530,408 | A * | 6/1996 | Vig et al. | 331/69 |
| 5,605,490 | A | 2/1997 | Laffey et al. | |
| 5,666,706 | A | 9/1997 | Tomita et al. | |
| 6,114,801 | A | 9/2000 | Tanaka | |
| 6,750,728 | B2 | 6/2004 | Takahashi | |
| 7,057,331 | B2 * | 6/2006 | Shimodaira et al. | 310/344 |
| 7,232,700 | B1 | 6/2007 | Kubena | 438/51 |
| 7,237,315 | B2 | 7/2007 | Kubena et al. | 29/25.35 |
| 7,459,099 | B2 | 12/2008 | Kubena et al. | 216/57 |
| 7,557,493 | B2 * | 7/2009 | Fujimoto | 310/349 |
| 7,564,177 | B2 * | 7/2009 | Yoshimatsu et al. | 310/365 |
| 7,579,748 | B2 * | 8/2009 | Kuroda | 310/312 |
| 2006/0022556 | A1 * | 2/2006 | Bail et al. | 310/344 |
| 2006/0055479 | A1 * | 3/2006 | Okazaki et al. | 331/158 |
| 2006/0197619 | A1 * | 9/2006 | Oishi et al. | 331/158 |
| 2009/0146527 | A1 * | 6/2009 | Lee et al. | 310/312 |

FOREIGN PATENT DOCUMENTS

| | | |
|---|---|---|
| EP | 0 531 985 | 3/1993 |
| JP | 57-091017 | 6/1982 |

(Continued)

OTHER PUBLICATIONS

Abe, T., et al., "One-Chip Multichannel Quartz crystal microbalance (QCM) Fabricated by Deep RIE," Sensors and Actuators, 2000, pp. 139-143.

(Continued)

*Primary Examiner*—Thomas M Dougherty
(74) *Attorney, Agent, or Firm*—Ladas & Parry (57) ABSTRACT

An oscillator having a quartz resonator, and a base wafer containing active electronics, wherein the quartz resonator is bonded directly to the base wafer and subsequently hermetically capped.

19 Claims, 6 Drawing Sheets

FOREIGN PATENT DOCUMENTS

| | | |
|---|---|---|
| JP | 04322507 | 11/1992 |
| JP | 08330878 | 12/1996 |
| JP | 2003-318685 A | 11/2003 |
| JP | 2006-352487 * | 12/2006 |
| WO | WO-84-00082 * | 1/1984 |

OTHER PUBLICATIONS

Aaltonen, T., et al., "ALD of Rhodium thin films from $Rh(acac)_3$ and Oxygen," Electrochemical and Solid-State Lett. 8, C99 (2005).

Cleland, A.N., et al., "Fabrication of High Frequency Nanometer Scale Mechanical Resonators From Bulk Si Crystals, "applied Physics Letters, Oct. 28, 1996.

Evoy, S., et al., "Temperature-dependent Internal Friction in Silicon Nanoelectromechanical Systems," Applied Physics Letters, vol. 77, No. 15.

Greer, J.A., et al., "Properties of SAW resonators fabricated on quartz substrates of various qualities," Ultrasonics Symposium, 1994 IEEE, vol. 1, Nov. 1-4, 1994, pp. 31-36.

Lin, J.W, et al., "A Robust High-Q Micromachined RF Inductor for RFIC Applications," IEEE Transactions on Electronic Devices, vol. 52, No. 7, pp. 1489-1496 (Jul. 2005).

Park, K.J., et al., "Selective area atomic layer deposition of rhodium and effective work function characterization in capacitor structures," Applied Physics Letters 89, 043111 (2006).

* cited by examiner

INTEGRATED QUARTZ OSCILLATOR ON AN ACTIVE ELECTRONIC SUBSTRATE

CROSS REFERENCE TO RELATED APPLICATIONS

This application claims the benefit of U.S. Provisional Application No. 60/836,600, filed on Aug. 8, 2006, which is incorporated herein by reference in its entirety. This application is also related to U.S. application Ser. No. 10/426,931, filed on Apr. 30, 2003, which is incorporated herein by reference in its entirety.

STATEMENT REGARDING FEDERALLY SPONSORED RESEARCH OR DEVELOPMENT

The present invention was made with support from the United States Government under Grant number DAAB07-02-C-P613 awarded by Defense Advanced Project Agency (DARPA). The United States Government has certain rights in the invention.

FIELD

The present invention relates to oscillators. More particularly, the present invention relates to quartz resonators being bonded directly to active electronics formed on a wafer to form an oscillator.

BACKGROUND

Small, low power, and high performance (low vibration sensitivity, low temperature drift, and low phase noise) oscillators are needed for a number of GPS, radio, and radar systems. Furthermore, cell phones and computer boards also are in need of highly stable clock and timing references for analog and digital processing. As phones and computer systems expand into multi-frequency operational modes, the need for multiple clock frequencies with low power requirements increases. This in turn increases the interest in small banks of low power oscillators that can replace higher power frequency synthesizers.

Typically, quartz-base oscillators are constructed using hybrid techniques. That is the quartz resonators are fabricated on a small single piece of quartz (typically about 1 inch square), tested, and mounted in a ceramic package with a surface mount circuit card using various epoxies containing conductive materials. The conductive epoxies used provide both mechanical and electrical connections to the resonator with low stress. Since no handle wafer is used in these fabrication processes, the resonators need to be thick enough so as not to break during the handling and mounting processes. Since the frequency is inversely dependent on the thickness for shear-mode devices, this means that frequencies above about 100 MHz (or quartz thicknesses below about 10 microns) have proved difficult to manufacture in this manner. In addition, for UHF operation, the resonator dimensions are significantly smaller than larger devices. This reduces the resonator's equivalent circuit parameters and increases the susceptibility of the circuit to stray capacitances. Typically, the intrinsic capacitance of UHF resonators ($C_0$) is in 0.1 pf range, and this requires that parasitic capacitances are below about 0.01 pf in order for them to not affect the operation of the oscillator. Thus, there is needed to reduce the stray signals to manageable levels.

According to the present disclosure, it is possible to integrate a resonator with active electronics to form a small, low power, and high performance (low vibration sensitivity, low temperature drift, and low phase noise) oscillator with reduced stray signals.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

A process, disclosed in the present application, may be used to attach a full wafer of resonators to a substrate wafer using low temperature bonding. This allows the complete integration of a wafer of resonators to a wafer containing an array of oscillator circuits for small size and low cost. Moreover, the use of handle wafer technology allows one to increase the frequency beyond the limits set by processing a single quartz wafer (around 100 MHz). Since the capacitance values of a properly scaled device decrease as the frequencies are increased, small parasitic capacitances become a significant source of performance degradation at higher frequencies. By integrating the resonators with miniaturized electronics on chip, these parasitic effects can be minimized for highly stable and reproducible performance for various oscillators across a wafer. In addition, integration allows small, rapid, and low power temperature compensation methods to be implemented near the resonators. This in turns provides the ability to construct ovenized oscillators with fast warm-up times (milliseconds instead of minutes for larger oscillators) with extremely low power requirements. Finally, oscillators presented in the present application have shown lower vibration sensitivity compared to commercial lower frequency units. This may be due to the stiffer cantilever structures needed for higher frequency operation.

Figure 1:
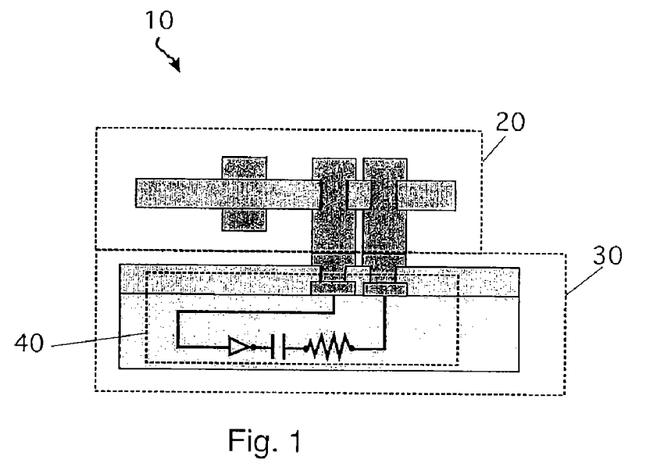
FIG. 1 depicts an oscillator according to the present disclosure.
Figure 2:
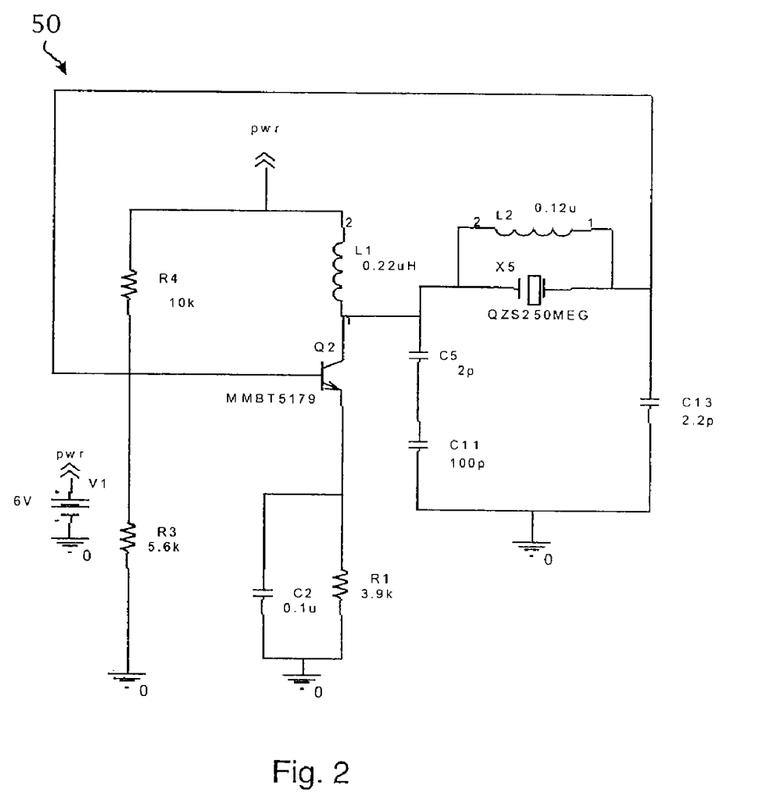
FIG. 2 depicts a circuit diagram of an oscillator feed back loop.

In one exemplary embodiment of the present disclosure, an integrated quartz resonator 20 bonded directly to a wafer 30 with active electronics 40 for the purpose of forming a small, low power, and low phase noise oscillator 10 is disclosed in FIG. 1. The wafer 30 may be composed of, for example, silicon (Si), SiGe or group III-V materials. FIG. 2 depicts a circuit diagram of an oscillator feed back loop 50 that may be implemented using the techniques disclosed in the present disclosure.

An exemplary method of fabricating oscillator 10 according to the present application will now be described with reference to FIG. 3-13.

Figure 3:
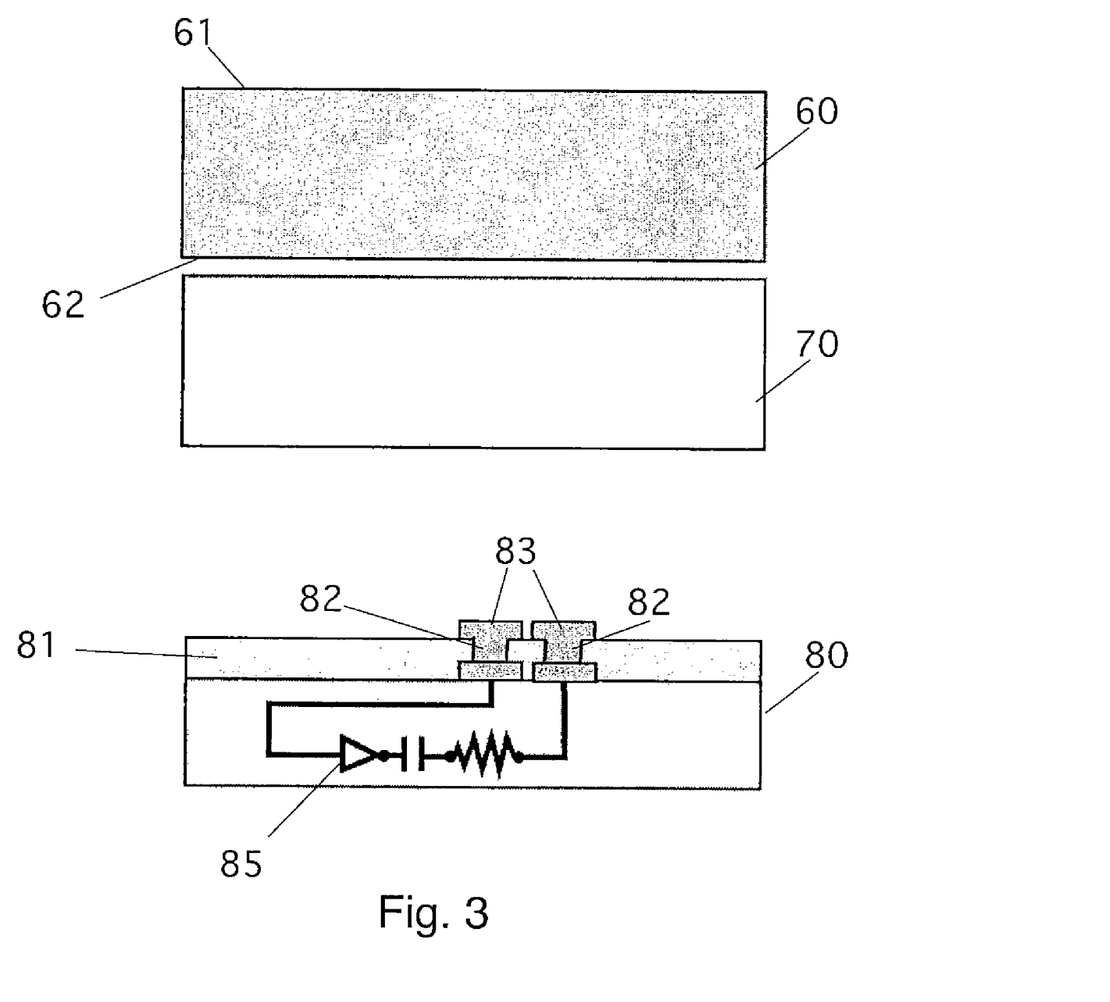
FIG. 3 depicts a quartz substrate, handle wafer, and a base wafer to be used in accordance with the present disclosure.

Referring to FIG. 3, a quartz substrate 60 having a first surface 61 and a second surface 62, a first substrate 70 (i.e. handle wafer), and a base wafer 80 containing active electronics 85 are provided. The first substrate 70 may comprise a material such as silicon or GaAs. In this embodiment, both the first substrate 70 and quartz substrate 60 may be provided in the form of a 3 inch or larger wafers.

Figure 4:
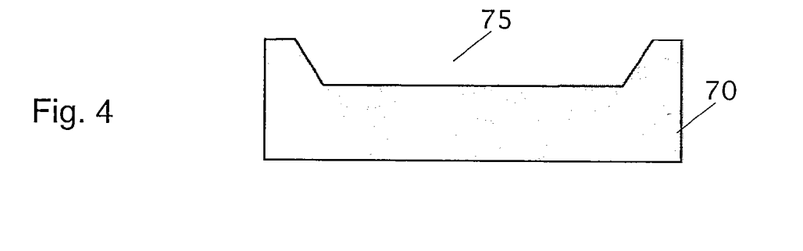
FIG. 4 depicts the handle wafer of FIG. 3 with a cavity.

A portion of the first substrate 70 is etched away creating a cavity 75, as shown in FIG. 4. The etched cavity 75 can be fabricated, for example, with a wet etch of potassium hydroxide, or a dry reactive ion etch using a gas having a fluorine chemistry.

Figure 5:
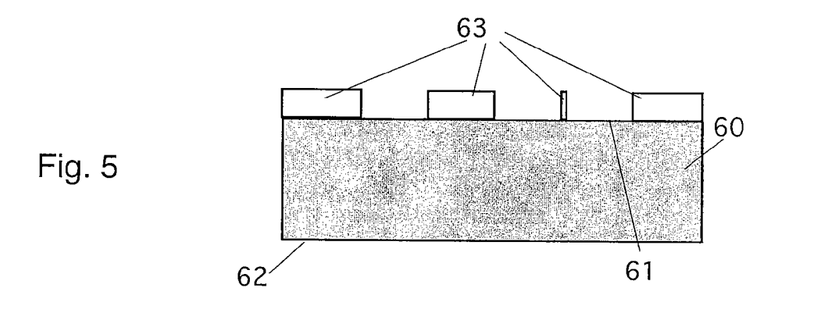
FIG. 5 depicts a photoresist on the quartz substrate of FIG. 3.
Figure 6:
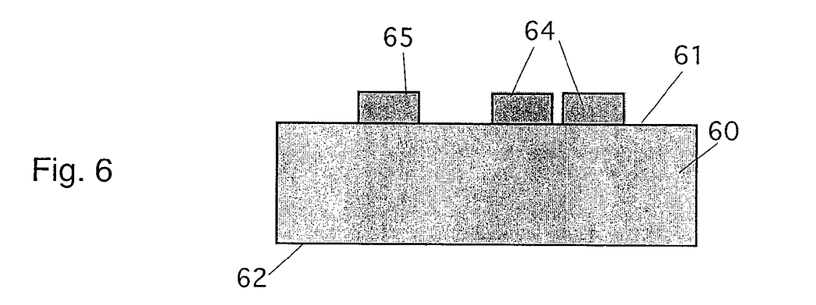
FIG. 6 depicts the quartz substrate of FIG. 3 with first electrodes and metal bonding pads.

The first surface 61 of the quartz substrate 60 is then patterned and metallized using a lift-off technique. In the lift-off technique, a thin layer of photoresist 63 is patterned on the first surface 61 of the quartz substrate 60, as shown in FIG. 5. Using lithography, photoresist is removed in the regions where metallization is desired. The metal is then deposited on the photoresist 63 and in the regions where the photoresist 63 was removed. The photoresist is then removed leaving metal only in the desired regions on the first surface 61 of the quartz substrate 60 as shown in FIG. 6. During patterning and metallizing at least one first electrode pad 65 and its interconnect (not shown) are deposited on the first surface 61 of the quartz substrate 60. The first electrode pad 65 and its interconnect may be comprised of Al or Ti/Au, or Cr/Au, deposited in that order on the first surface 61 of the quartz substrate 60. Shown in FIG. 6 are also two interconnect metal pads 64 on the first surface 61 of the quartz substrate 60. The two interconnect metal pads 64 may be comprised of Ti/Pt/Au or Cr/Pt/Au. In one exemplary embodiment, one of interconnect pads 64 may be electrically connected with the first electrode pad 65 through the interconnect (not shown). The purpose of the two interconnect metal pads 64 and the first electrode pad 65 will be discussed later.

Figure 7:
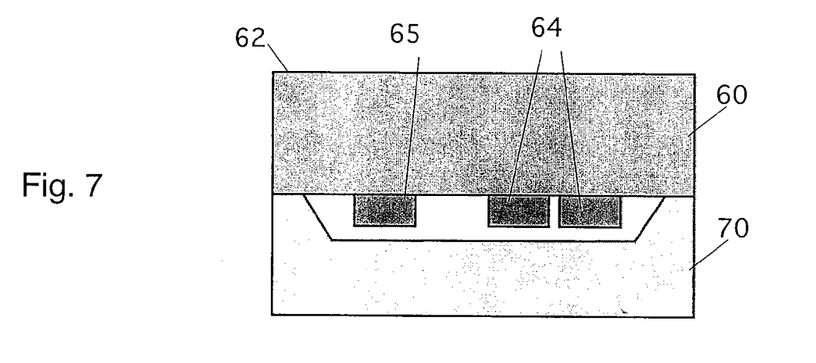
FIG. 7 depicts the quartz substrate of FIG. 3 bonded to the handle wafer of FIG. 4.

After the interconnect pads 64 and the first electrode pad 65 are deposited, the quartz substrate 60 may be bonded to the etched first substrate 70, as shown in FIG. 7 using for example, an EV 501 Wafer Bonder which is commercially available. To bond the quartz substrate 60 to the first substrate 70, the quartz substrate 60 and first substrate 70 are thoroughly cleaned in a megasonic cleaning system, which makes use of ultrasonic waves to remove particle contaminants. After the wafers are cleaned, they are brought in contact with each other and annealed. The contact between the quartz substrate 60 and the first substrate 70 creates a bond due to hydrogen bonding of silanol (Si—O—H) groups followed by the covalent bonding of siloxanes (Si—O—Si) after a heat treatment. The quartz substrate 60 is bonded to the etched first substrate 70 such that the interconnect pads 64 and the first electrode pad 65 are now located in the cavity 75 of the first substrate 70.

Figure 8:
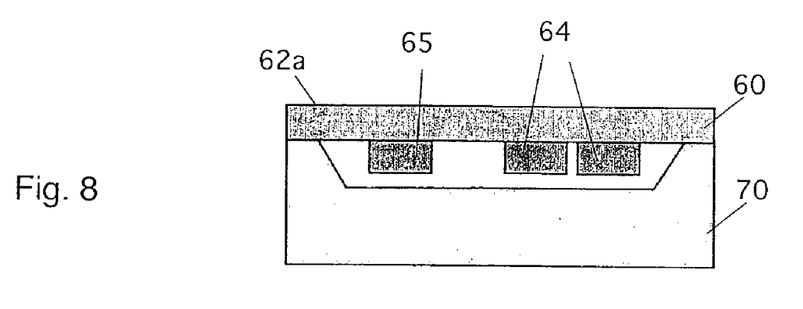
FIG. 8 depicts the quartz substrate of FIG. 7 being thinned.

After the bonding of the quartz substrate 60 and the etched first substrate 70, the second surface 62 of the quartz substrate 60 undergoes a thinning process to obtain thinned second surface 62a of about 10 micrometers or less, as shown in FIG. 8. In order to thin the quartz substrate 60, the following method may be used. The quartz substrate 60 may be thinned, for example, using a mechanical lapping and polishing system. Lapping and polishing systems are well known and commercially available from manufacturers such as Logitech. In a mechanical lapping and polishing system, a polishing head is spun at a high rate of speed. The lapping and polishing system also comprises a nozzle for dispensing slurry on the quartz substrate 60. While spinning, the polishing head contacts the quartz substrate 60 in the presence of the slurry, thereby evenly grinding away portions of the quartz substrate 60. The slurry may be comprised of chemicals such as aluminum oxide to remove quartz from the quartz substrate 60. Mechanical grinding may also be used to thin the quartz substrate 60.

In another example, a portion of the quartz substrate 60 may be thinned, for example, using reactive ion etching (RIE) with $CF_4$ or $SF_6$. While being thinned in the RIE machine, the thickness of quartz substrate 60 may be monitored using spectropic ellipsometry or reflectometry techniques as known to one skilled in the art.

After using RIE to thin the quartz substrate 60, the surface of the quartz substrate 60 may have imperfections that need to be corrected. This can be accomplished by using, for example, the mechanical lapping and polishing system described above with a chemical such as silica or cerium oxide, to remove about 0.01-0.02 micrometers of quartz, followed up with a wet etch in ammonium bifluoride to remove about 0.005 micrometers of quartz from the quartz substrate 60. This helps ensure a polished, defect free quartz substrate 60.

Figure 9:
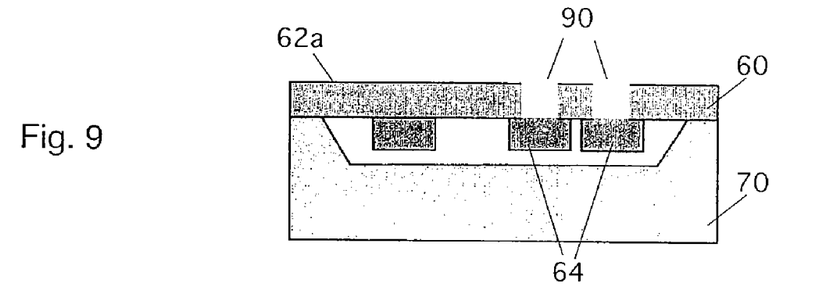
FIG. 9 depicts vias formed in the quartz substrate of FIG. 8.
Figure 10:
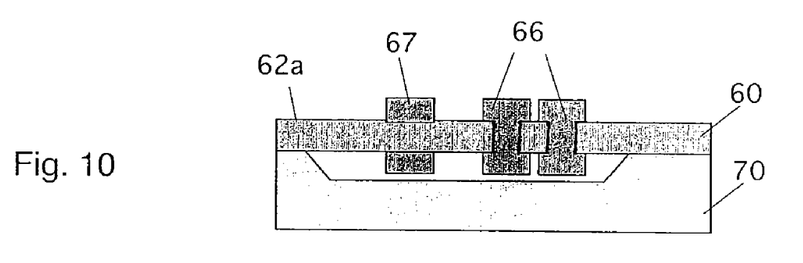
FIG. 10 depicts second electrodes and bottom metal bonding pads on the quartz substrate of FIG. 9.

After the quartz substrate 60 is thinned, vias 90 are fabricated in the quartz substrate 60, as shown in FIG. 9. In one exemplary embodiment, only one via 90 may be fabricated in the quartz substrate 60. The vias 90 may be created using lithography techniques well known in the art. The vias 90 are contacts that are etched through the quartz substrate 60 to the interconnect pads 64. Once the vias 90 are fabricated, the vias 90 are metallized and the thinned second surface 62a of the quartz substrate 60 is patterned and metallized, as shown in FIG. 10, using the lift-off technique described for depositing the interconnect pads 64. During the metallization step, interconnect pads 66 are deposited on the thinned second surface 62a over the vias 90. The interconnect pads 66 may be comprised of a combination of Ti, Pt, Au, or Cr, Pt, Au, deposited in that order on the thinned second surface 62a of the quartz substrate 60.

The interconnect pads 64, 66 are connected through the vias 90. Additionally, a second metal electrode pad 67 and its interconnect (not shown) are deposited as shown in FIG. 10. The second electrode pad 67 may be comprised of Al or Ti/Au or Cr/Au. In exemplary embodiment, the electrode pad 67 may be electrically connected with one of the interconnect pads 66 through its interconnect (not shown).

Figure 11:
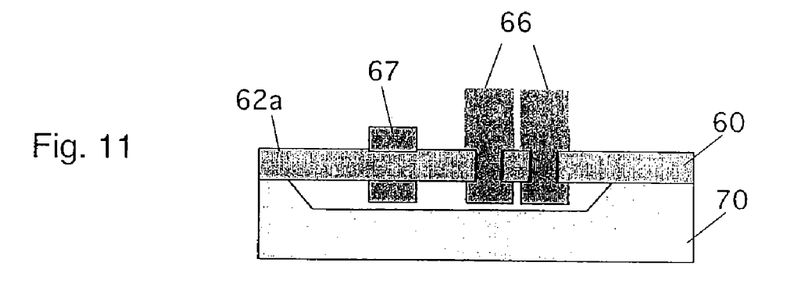
FIG. 11 depicts the bottom metal bonding pads of the quartz substrate of FIG. 10 with increased thickness.

Once the interconnect pads 66 and the second electrode pad 67 have been deposited, another pattern and metalize step may be performed using the lift-off technique described above and applied to the interconnect pads 66 to increase the thickness of the interconnect pads 66 as shown in FIG. 11 if necessary.

Figure 12:
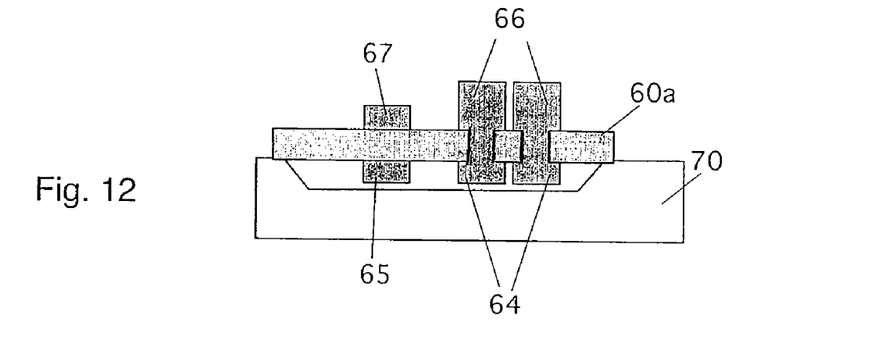
FIG. 12 depicts a portion of the quartz substrate having been removed to define the resonator on the handle wafer.

Once the thickness of the interconnect pads 66 is increased, a portion of the quartz substrate 60 is removed, thereby creating an isolated quartz resonator 60a, as shown in FIG. 12.

Portion of the quartz substrate 60 may be removed using lithography and REI techniques well known in the art to divide the quartz substrate into individual devices and determine the desired dimensions of the quartz resonators 60a.

The first and second electrode pads 65, 67 on the modified quartz substrate 60a apply an RF field across the resonator to drive it into oscillation at its natural resonant frequency. By ablating a portion of the first electrode pad 65 or second electrode pad 67, the resonant frequency of the quartz substrate 60a can be adjusted. The first and second electrode pads 65, 67 can be ablated using known techniques such as ion beam milling or laser ablation. It is to be understood that one skilled in the art can also adjust the resonant frequency by adding mass to the first and second electrode pads 65, 67 without taking away from the patentable aspect of the present disclosure.

As already mentioned above with reference to the detailed description of FIG. 3, a base wafer 80 is provided. The base wafer 80 may be comprised of, for example, silicon (Si), SiGe or group III-V materials and may contain a dielectric layer 81 containing vias 82 electrically connecting active electronics 85 with conductive pads 83.

Figure 13:
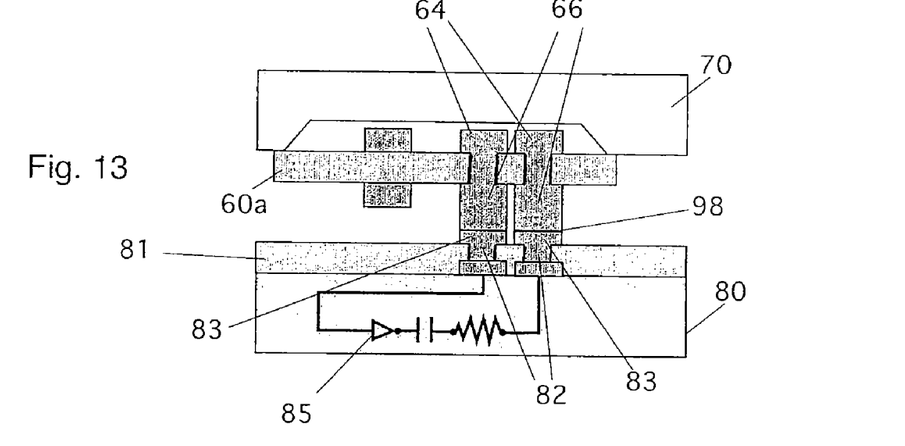
FIG. 13 depicts the quartz substrate being bonded to the base wafer of FIG. 3.

After the thickness of the interconnect pads 66 is increased, the interconnect pads 66 of the resonator 60a are bonded to the conductive pads 83 along bonding line 98, as shown in FIG. 13 using, for example, a low temperature metal bond such as Au/In or Au/Sn. In the Au—In thermal compression bonding scheme, the quartz resonator 60a, the interconnect pads 66, the conductive pads 83, and the base wafer 80 are heated to a temperature of about 100° C. in a vacuum having a pressure no greater than 10' Torr. Then the interconnect pads 66 and the conductive pads 83 are pressed together, while being depressurized, with a pressure of approximately 1 MPa. This will fuse the conductive pads 83 and the interconnect pads 66 together, as shown in FIG. 13.

Figure 14:
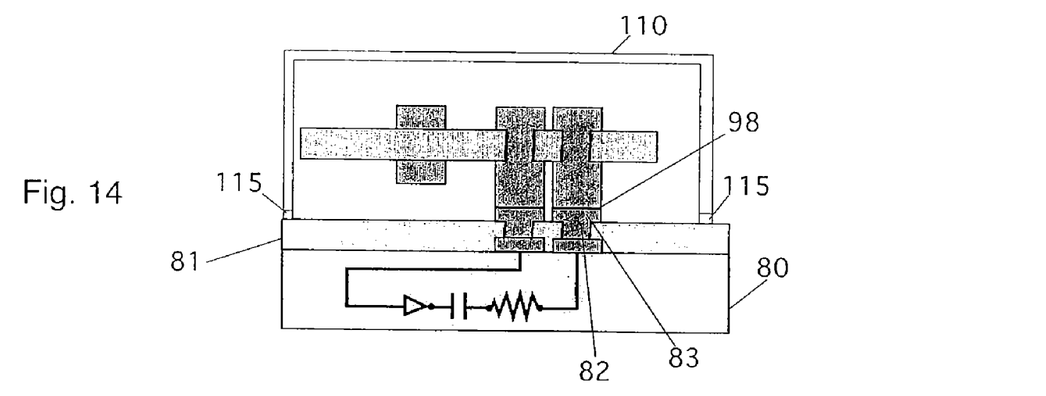
FIG. 14 depicts the quartz resonator being released from the handle wafer.

The bonding of the interconnect pads 66 to the conductive pads 83 provides electrical access from the conductive pads 83 to the first and second electrode pads 65, 67. After the interconnect pads 66 have been bonded to the conductive pads 83, first substrate 70 (handle wafer) is removed from the remaining structure, using a combination of wet and dry etches so that an oscillator is obtained as shown in FIG. 14. In one exemplary embodiment, the structure in FIG. 14 may be hermetically capped by a capping wafer 110 that has been etched to have a cavity. The capping wafer 110 may contain Si material. The capping wafer 110 may be bonded to the dielectric layer 81 using for example low temperature metal-to-metal bond 115 such as Au/In.

The purpose of the first and second electrode pads 65, 67 is to receive an electrical signal from the conductive pads 83 that can bias or drive the modified quartz substrate 60a with an electric field. The electrical signal is preferably an AC signal. When the electrical signal is received by the first and second electrodes 65, 67 a stress is placed on the modified quartz resonator 60a. This stress stimulates the mechanical resonant frequency of the modified quartz resonator 60a by the well-known piezoelectric effect, thereby causing the modified quartz resonator 60a to oscillate at its resonant frequency. Additionally, it is also possible to use the first and second electrodes 65, 67 to sense the movement of the modified quartz substrate 60a relative to a specified plane (not shown). Once the modified quartz substrate 60a is oscillating at its resonant frequency, it can be used to drive other electrical components at a frequency equal to its resonant frequency with electrical gain due to the high Q of the quartz resonator.

Obviously, other variations and process steps could be implemented for attaching the resonator 20 to the base wafer 30, depending on the degree to which one is willing to modify the top surface of the wafer 80.

Figure 15:
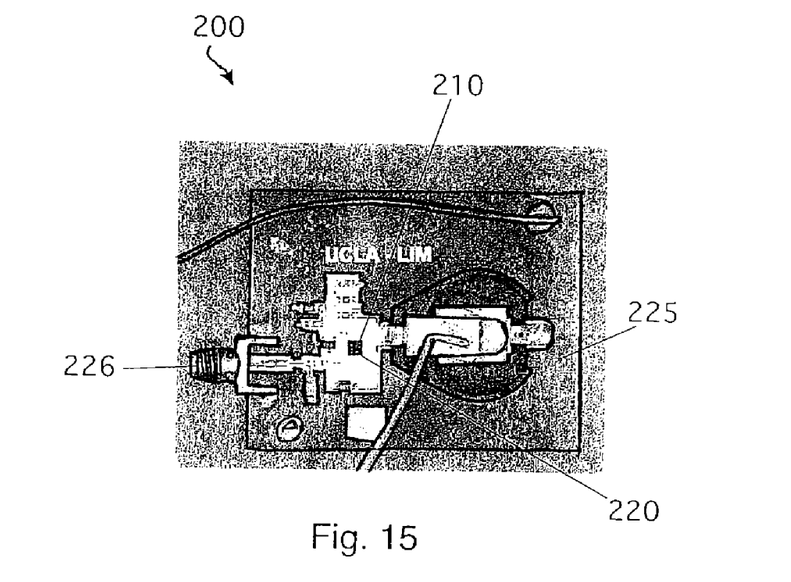
FIG. 15 depicts an exemplary UHF hybrid MEMS oscillator according to the present disclosure.
Figure 16:
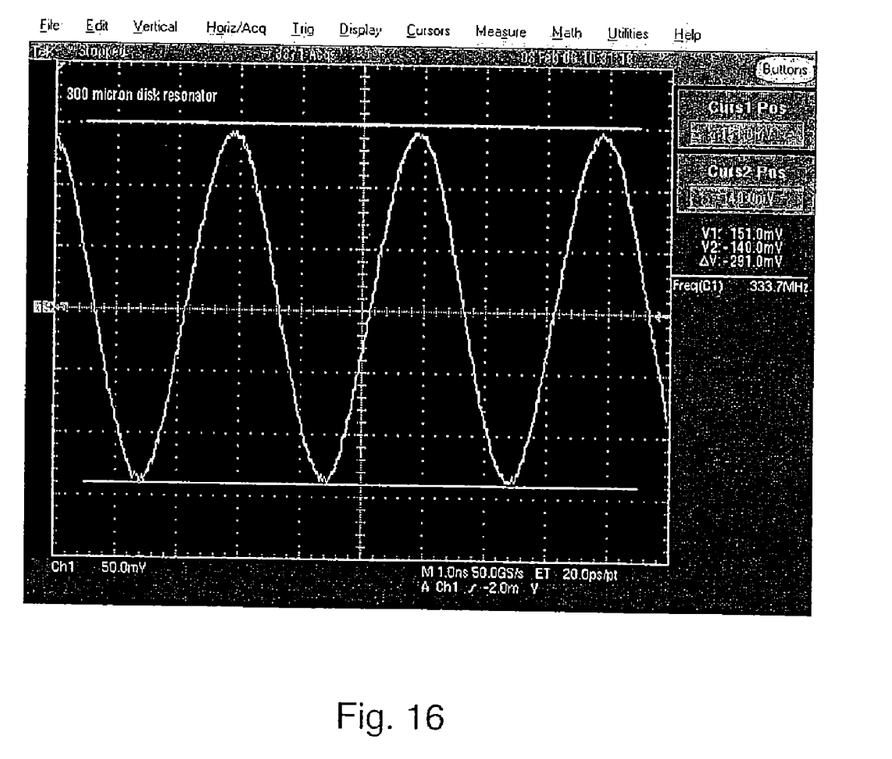
FIG. 16 depicts a waveform of an output signal generated by the oscillator of FIG. 15.

FIG. 15 depicts an exemplary UHF hybrid MEMS oscillator 200 according to the present disclosure. The quartz MEMS resonators 210 are located on a silicon (Si) substrate 220 that is glued to the copper-clad Duroid surface mount card 225. The copper cladding may be removed from around the circuits components to reduce parasitic capacitance. FIG. 16 depicts a waveform of an output signal generated by the oscillator 200 through output 226 using 326-MHz disk resonator 210.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. An oscillator comprising:
    a quartz resonator having a first surface, at least one first electrode being coupled with or disposed on the first surface, and at least one via connected to the at least one first electrode, the at least one via being filled with a metal; and
    a base wafer containing active electronics, wherein the quartz resonator is bonded with the base wafer.

2. The oscillator of claim 1, wherein the base wafer further comprises at least one conductive pad electrically connected to the active electronics.

3. The oscillator of claim 2, wherein the quartz resonator comprises:
    a second surface opposite the first surface; and
    at least one second electrode on the second surface.

4. The oscillator of claim 3, wherein the bond between the base substrate and the quartz resonator comprises a bond between the conductive pads on the base substrate and a first and second interconnect pads.

5. The oscillator of claim 4, wherein a resonant frequency is adjusted by trimming the thickness of the first or second electrode.

6. The oscillator of claim 5, wherein the resonant frequency is adjusted by trimming the thickness of the second electrode before bonding to the base substrate while performing real-time monitoring of the resonant frequency using probes contacting the first and second interconnect pads on the quartz substrate.

7. The oscillator of claim 5, wherein the resonant frequency is adjusted by trimming the first electrode after bonding to the base substrate.

8. The oscillator of claim 1, wherein the quartz resonator is hermetically capped.

9. A method for fabricating the oscillator of claim 1, the method comprising:
   providing a first substrate having a cavity etched therein;
   providing a crystalline quartz substrate having a first major surface opposite a second major surface;
   bonding the quartz substrate to the first substrate wherein a portion the first major surface is over the cavity;
   thinning the quartz substrate along the second major surface;
   removing a portion of the quartz substrate to expose a portion of the first substrate and to define a quartz resonator;
   bonding the quartz resonator with a base wafer containing active electronics, and
   removing the first substrate, thereby releasing the quartz resonator,
   wherein the base wafer comprises:
   a dielectric layer containing vias that electrically connect the active electronics with a plurality conductive pads supported by the dielectric layer.

10. A method for fabricating the oscillator of claim 1, the method comprising:
    providing a first substrate having a cavity etched therein;
    providing a crystalline quartz substrate having a first major surface opposite a second major surface;
    bonding the quartz substrate to the first substrate wherein a portion the first major surface is over the cavity;
    thinning the quartz substrate along the second major surface;
    removing a portion of the quartz substrate to expose a portion of the first substrate and to define a quartz resonator;
    bonding the quartz resonator with a base wafer containing active electronics; and
    removing the first substrate, thereby releasing the quartz resonator.

11. The method of claim 10, wherein the base wafer comprises a member selected from the group consisting of Si, group III-V elements, and SiGe.

12. The method of claim 10, wherein the base wafer comprises:
    a dielectric layer comprising vias that electrically connect the active electronics with a plurality conductive pads supported by the dielectric layer.

13. The method of claim 12, wherein the quartz substrate comprises:
    a first surface opposite a second surface;
    at least one first electrode on the first surface; and
    at least one second electrode on the second surface.

14. The method of claim 13, wherein the quartz substrate further comprises at least one via connected to the at least one first electrode, wherein the at least one via is filled with a metal.

15. The method of claim 13, wherein the first and second electrodes are electrically connected to interconnect metal pads on the second surface of the quartz substrate.

16. The method of claim 15, wherein the bonding of the quartz substrate to the base wafer comprises bonding the plurality of conductive pads on the base wafer to the interconnect metal pads for the first and second electrode, thereby allowing a signal to flow between the first and second electrodes.

17. The method of claim 16, wherein the bonding is a metal-to-metal thermal compression bond performed at temperature below 300° C.

18. The method of claim 13, wherein the mass of the first or second electrodes is changed to adjust a resonant frequency.

19. The method of claim 13, wherein the second electrode is ablated to adjust a resonant frequency.

* * * * *